(12) United States Patent
Matsueda et al.

(10) Patent No.: US 8,654,040 B2
(45) Date of Patent: Feb. 18, 2014

(54) ELECTRO-OPTICAL DEVICE, MATRIX SUBSTRATE, AND ELECTRONIC EQUIPMENT

(75) Inventors: Yojiro Matsueda, Chino (JP); Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 471 days.

(21) Appl. No.: 12/461,072

(22) Filed: Jul. 30, 2009

(65) Prior Publication Data

US 2009/0289931 A1 Nov. 26, 2009

Related U.S. Application Data

(63) Continuation of application No. 10/636,569, filed on Aug. 8, 2003, now abandoned.

(30) Foreign Application Priority Data

Sep. 18, 2002 (JP) .................................. 2002-272063
Aug. 4, 2003 (JP) .................................. 2003-286295

(51) Int. Cl.
   *G09G 3/00* (2006.01)
(52) U.S. Cl.
   USPC .............................. 345/76; 345/82; 345/211
(58) Field of Classification Search
   None
   See application file for complete search history.

(56) References Cited

U.S. PATENT DOCUMENTS

| | | | |
|---|---|---|---|
| 5,841,414 A * | 11/1998 | Tanaka ............................. | 345/87 |
| 6,151,005 A * | 11/2000 | Takita et al. .................... | 345/89 |
| 6,369,785 B1 | 4/2002 | Imai | |
| 6,424,328 B1 * | 7/2002 | Ino et al. .......................... | 345/87 |
| 6,429,837 B1 | 8/2002 | Ishizuka et al. | |
| 6,518,557 B1 | 2/2003 | Izumi et al. | |
| 6,538,374 B2 | 3/2003 | Hosokawa | |
| 6,587,177 B2 | 7/2003 | Kato | |
| 6,639,589 B1 * | 10/2003 | Kim et al. ...................... | 345/206 |
| 6,738,030 B2 * | 5/2004 | Kim et al. ........................ | 345/45 |
| 6,825,820 B2 * | 11/2004 | Yamazaki et al. .............. | 345/76 |
| 6,851,184 B2 * | 2/2005 | Lee et al. ......................... | 29/847 |
| 6,961,054 B2 | 11/2005 | Matsumoto | |
| 7,148,630 B2 | 12/2006 | Koyama et al. | |
| 2001/0024083 A1 | 9/2001 | Yamazaki et al. | |
| 2001/0026257 A1 * | 10/2001 | Kimura .......................... | 345/87 |
| 2001/0043168 A1 * | 11/2001 | Koyama et al. ................. | 345/52 |
| 2002/0175887 A1 | 11/2002 | Yamazaki | |
| 2003/0164919 A1 | 9/2003 | Oh et al. | |
| 2004/0125101 A1 | 7/2004 | Choi et al. | |
| 2004/0183075 A1 | 9/2004 | Koyama et al. | |

FOREIGN PATENT DOCUMENTS

| | | |
|---|---|---|
| JP | U-02-069497 | 5/1990 |
| JP | A-04-190285 | 7/1992 |
| JP | A-07-152327 | 6/1995 |

(Continued)

*Primary Examiner* — Seokyun Moon
(74) *Attorney, Agent, or Firm* — Oliff, PLC

(57) ABSTRACT

The invention provides power-supply wiring preferable for large displays. An electro-optical device according to the present invention includes a pixel area including electro-optical elements driven by power supplied from power-supply circuits. The electro-optical device includes basic power-supply lines, which receive a power-supply voltage output from the power-supply circuits and which are formed on the upper portion of a substrate, and includes main power-supply lines which intersect the basic power-supply lines and which are formed on the upper portion of the substrate. The power-supply voltage is supplied to the electro-optical elements via the main power-supply lines.

5 Claims, 5 Drawing Sheets

(56) References Cited

FOREIGN PATENT DOCUMENTS

| | | | |
|---|---|---|---|
| JP | A-10-032229 | 2/1998 | |
| JP | A-11-008064 | 1/1999 | |
| JP | A-11-024606 | 1/1999 | |
| JP | 11282419 | * 10/1999 | |
| JP | A-2000-206936 | 7/2000 | |
| JP | A-2000-221904 | 8/2000 | |
| JP | A-2000-227784 | 8/2000 | |
| JP | A-2000-276068 | 10/2000 | |
| JP | A-2001-109395 | 4/2001 | |
| JP | A-2001-143967 | 5/2001 | |
| JP | A-2001-159878 | 6/2001 | |
| JP | A-2001-230086 | 8/2001 | |
| JP | A-2000-284721 | 10/2001 | |
| JP | A-2001-296830 | 10/2001 | |
| JP | A-2002-32037 | 1/2002 | |
| JP | A-2002-032037 | 1/2002 | |
| JP | A-2002-040961 | 2/2002 | |
| JP | A-2002-108252 | 4/2002 | |
| JP | A-2002-151276 | 5/2002 | |
| KR | 2002-0000875 | 1/2002 | |
| WO | WO 01/62051 A1 | 8/2001 | |

* cited by examiner

ELECTRO-OPTICAL DEVICE, MATRIX SUBSTRATE, AND ELECTRONIC EQUIPMENT

This is a Continuation of application Ser. No. 10/636,569 filed Aug. 8, 2003, which claims priority to Japanese Applications Nos. 2002-272063 and 2003-286295 filed Sep. 18, 2002 and Aug. 4, 2003. The disclosures of the prior applications are hereby incorporated by reference herein in their entirety.

BACKGROUND OF THE INVENTION

1. Field of Invention

The present invention relates to an arrangement of power-supply wiring of an electro-optical device suitable for a large display panel.

2. Description of Related Art

Since organic EL elements are electrically driven light-emitting elements, a backlight is not needed. Additional advantages include their low electrical power consumption, wide field of view, and high contrast ratio. Organic EL elements are used for small and medium size displays for devices, such as cellular phones and personal digital assistants. An organic EL element is an electro-optical element with a light-emitting layer including fluorescent material interposed between an anode and a cathode. Supplying a forward biased current between the two types of electrodes causes holes injected from the anode and electrons injected from the cathode to recombine. The recombination energy generated causes the organic EL element to emit light. In related art active-matrix-driven organic EL display panels, in general, anode power-supply lines are wired in on a pixel area of the active matrix substrate where pixels are arranged in a matrix, while a cathode film, which is a common electrode, is disposed over the entire pixel area. An enhancement that lowers the electrical power consumption and enhances the light-emitting efficiency of a display apparatus by enhancing or optimizing the wiring arrangement is disclosed in, for instance, Japanese Unexamined Patent Application Publication No. 11-24606.

SUMMARY OF THE INVENTION

When using electrically driven light-emitting elements, such as organic EL elements for large displays, it is advantageous to reduce or prevent an increase in electrical power consumption due to the resistance of the power-supply wiring while maintaining an even display. When the distribution of the electrical current supplied to the entire screen is not uniform, the display becomes uneven and the display performance is lowered.

As the display becomes large, the number of pixels needed for the display increases exponentially, causing the number of data lines and scanning lines to become enormous. The problem to be addressed or solved in providing a large organic EL display panel is how to mount the data line drivers and the scanning line drivers.

The present invention provides power-supply wiring technology suitable for large displays. The present invention also provides techniques of mounting suitable driver circuits for large displays.

To address or solve the above, an electro-optical device according to the present invention has a pixel area including electro-optical elements driven by electrical power received from power-supply circuits. The electro-optical device includes basic power-supply lines disposed on the upper portion of the substrate, which receive a power-supply voltage from the power-supply circuits, and main power-supply lines disposed on the upper portion of the substrate, which intersect and connect with the basic power-supply lines. The power-supply voltage is supplied to the electro-optical elements via the main power-supply lines.

By forming power-supply wiring so that the power-supply voltage is received by the basic power-supply lines with low resistance and by supplying the power-supply voltage to the electro-optical elements from the main power-supply lines connected to the basic power-supply lines, the power-supply voltage is evenly supplied to each pixel within the pixel area. As a result, an even display is provided for the electro-optical device.

For the electro-optical device according to the present invention, desirably, the main power-supply lines are arranged in a direction that intersects the basic power-supply lines in a strip pattern. By arranging the main power-supply lines in a strip pattern, a desired amount of electrical power may be supplied to each electro-optical element.

For the electro-optical device according to the present invention, desirably, the main power-supply lines are arranged in a direction that intersects substantially orthogonally the basic power-supply lines. By arranging the main power-supply lines in a substantially orthogonal direction with respect to the basic power-supply lines, electrical power may efficiently be supplied to the electro-optical elements, which are arranged in two directions perpendicular to each other.

For the electro-optical device according to the present invention, desirably, the line thickness of the main power-supply lines is smaller than the line thickness of the basic power-supply lines. By making the line thickness of the basic power-supply lines larger than the line thickness of the main power-supply lines, the resistance of the basic power-supply lines can be reduced.

For the electro-optical device according to the present invention, desirably, the basic power-supply lines are arranged on the outside edges of the pixel area, and the main power-supply lines are arranged in a direction that intersects the basic power-supply lines. By arranging the basic power-supply lines on the outside edges of the pixel area, the main power-supply lines may be formed from the basic power-supply lines to the entire pixel area.

For the electro-optical device according to the present invention, desirably, the basic power-supply lines are arranged in linearly symmetrical pairs on the outside edges of the pixel area. By arranging the basic power-supply lines linearly symmetrically, electrical power may be supplied to each electro-optical element disposed on the pixels area over a large area.

For the electro-optical device according to the present invention, desirably, the main power-supply lines are arranged so that the arrangement pitch is substantially equal. By arranging the main power-supply lines with equal pitch, electrical power may be supplied to each electro-optical element in a well-balanced manner.

For the electro-optical device according to the present invention, desirably, auxiliary power-supply lines that intersect the main power-supply lines are further provided. By newly forming auxiliary power-supply lines that intersect the main power-supply lines, the resistance of the entire power-supply wiring may be reduced.

For the electro-optical device according to the present invention, desirably, the auxiliary power-supply lines are arranged in a direction that intersects the main power-supply lines in a strip pattern. By arranging the auxiliary power-supply lines in a strip pattern, the resistance of the power-supply wiring may be reduced.

For the electro-optical device according to the present invention, desirably, the auxiliary power-supply lines are arranged in a direction that substantially orthogonally intersects the main power-supply lines. By arranging the auxiliary power-supply lines in a substantially orthogonal direction with respect to the main power-supply lines, a desired amount of electrical power may be supplied to the electro-optical elements, which are arranged in two directions perpendicular to each other in a well-balanced manner.

For the electro-optical device according to the present invention, desirably, the power-supply wiring is arranged so that the electro-optical elements are disposed on the pixel area and the pixel area is sectioned into a plurality of pixel groups each including at least one of the electro-optical elements, and the pixel groups receive power from different power-supply circuits. By supplying electrical power to pixel groups from different power-supply circuits, the power-supply voltage may be corrected, and, as a result, any difference between power-supply circuits may be corrected.

For the electro-optical device according to the present invention, desirably, the power-supply circuits are enclosed in tape carrier packages and are contained in driver IC chips bonded to the substrate. Using external circuits as the power-supply circuits is suitable for a large display.

For the electro-optical device according to the present invention, desirably, scanning lines to select a group of electro-optical elements lined up in one direction are arranged, and scanning line drivers to simultaneously drive at least two scanning lines are provided. By simultaneously driving two or more scanning lines, the driving frequency for the scanning line drivers may be reduced and this is suitable for a large display.

For the electro-optical device according to the present invention, desirably, data lines to transmit data signals, which regulate the gradation of the light emitted from the electro-optical element, are further provided, and the data signals are supplied from the driver IC chips. Disposing data line drivers in the external circuits of the substrate is suitable for a large display.

For the electro-optical device according to the present invention, desirably, analog switches to switch the output of the data signals supplied from the driver IC chips to the data lines are provided. By providing the analog switches to switch the data line output to the data lines, the number of data lines supplied from the driver IC chips to the substrate may be reduced, and, as a result, this is suitable to simplify the circuit board.

The electro-optical device according to the present invention has, on the substrate, electro-optical elements driven by electrical power supplied from power-supply circuits. The electro-optical device has, on the edge of the substrate, external driver circuits to drive and control the electro-optical elements. Each pixel group including a plurality of electro-optical elements is driven and controlled by each driver circuit. Driving and controlling the pixels with the external driver circuits is suitable for a large display.

For the electro-optical device according to the present invention, desirably, the driver circuits that are driver IC chips enclosed in tape carrier packages are provided. By enclosing the driver circuits in the tape carrier packages, the driver circuits may easily be mounted on the circuit board.

For the electro-optical device according to the present invention, desirably, the driver IC chips that are the data line drivers are provided.

For the electro-optical device according to the present invention, desirably, the electro-optical elements that are electroluminescent elements are provided. By using the electroluminescent elements, electrically driven light-emitting elements that emit light may be provided.

The electronic apparatus according to the present invention has the above electro-optical device. The electronic apparatus is not limited to a particular apparatus as long as it has a display device. The electronic apparatus, for instance, may be a cellular phone, a video camera, a personal computer, a head-mounted display, a projector, a facsimile machine, a digital camera, a portable television, a DSP device, a PDA, or an electronic databook, for example.

The matrix substrate according to the present invention has a pixel area to dispose the electro-optical elements driven by power supplied from the power-supply circuits. The matrix substrate has basic power-supply lines, which are disposed on the upper portion of the substrate and which receive a power-supply voltage output from the power-supply circuits, and main power-supply lines, which intersect and connect with the basic power-supply lines and are disposed on the upper portion of the substrate. The main power-supply lines supply the power-supply voltage to the electro-optical elements.

Arranging the power-supply wiring so that the basic power-supply lines with low resistance receive a power-supply voltage and the main power-supply lines connect to the basic power-supply lines, which supply the power-supply voltage to the electro-optical elements, provides a uniform power supply to the pixel in the pixel area. Thus, the matrix substrate will provide a display without unevenness. The term "matrix substrate" refers to a wiring board on which electro-optical elements are not yet mounted.

For the matrix substrate according to the present invention, desirably, the main power-supply lines are arranged in a strip pattern in a direction that intersects the basic power-supply lines. By arranging the main power-supply lines in a strip pattern, a desired amount of electrical power may be supplied to each electro-optical element.

For the matrix substrate according to the present invention, desirably, the main power-supply lines are arranged in a direction that is substantially orthogonal to the basic power-supply lines. By arranging the main power-supply lines in a direction that is substantially orthogonal to the basic power-supply lines, electrical power may be supplied efficiently to the electro-optical elements arranged in two directions perpendicular to each other.

For the matrix substrate according to the present invention, desirably, the line thickness (width) of the main power-supply lines is smaller than the line thickness (width) of the basic power-supply lines. By making the line thickness of the basic power-supply lines larger than that of the main power-supply lines, the resistance of the basic power-supply lines may be reduced.

For the matrix substrate according to the present invention, desirably, the basic power-supply lines are wired on the outside edges of the pixel area, and the main power-supply lines are arranged in a direction that intersects the basic power-supply lines. By arranging the basic power-supply lines on the outside edges of the pixel area, the main power-supply lines may be arranged from the basic power-supply lines to the entire pixel area.

For the matrix substrate according to the present invention, desirably, the basic power-supply lines are linearly symmetrically arranged in pairs on the outside edges of the pixel area. By linearly symmetrically arranging the basic power-supply lines, electrical power may be supplied, in a well-balanced manner, to each electro-optical element arranged in the pixel area over a large area.

For the matrix substrate according to the present invention, desirably, the wiring of the main power-supply lines is arranged with equal pitch. By arranging the main power-supply lines with equal pitch, electrical power may be supplied, in a well-balanced manner, to each electro-optical element.

For the matrix substrate according to the present invention, desirably, the auxiliary power-supply lines intersecting the main power-supply lines are further provided. By newly forming auxiliary power-supply lines that intersect the main power-supply lines, the resistance of the entire power-supply wiring may be reduced.

For the matrix substrate according to the present invention, desirably, the auxiliary power-supply lines are arranged in a strip pattern in a direction that intersects the main power-supply lines. By arranging the auxiliary power-supply lines in a strip pattern, the resistance of the power-supply wiring may be reduced.

For the matrix substrate according to the present invention, desirably, the auxiliary power-supply lines are arranged in a direction that intersects substantially orthogonally the main power-supply lines. By arranging the auxiliary power-supply lines in a direction that intersects substantially orthogonally the main power-supply lines, a desired amount of electrical power may be supplied, in a well-balanced manner, to the electro-optical elements arranged in two directions perpendicular to each other.

For the matrix substrate according to the present invention, desirably, the power-supply wiring is arranged so that the electro-optical elements are disposed on the pixel area and the pixel area is sectioned into a plurality of pixel groups each including at least one of the electro-optical elements, and the pixel groups receive power from different power-supply circuits. By supplying electrical power to pixel groups from different power-supply circuits, the power-supply voltage may be corrected, and, as a result, the difference between power-supply circuits may be corrected.

DETAILED DESCRIPTION OF PREFERRED EMBODIMENTS

Exemplary Embodiment 1

Figure 1:
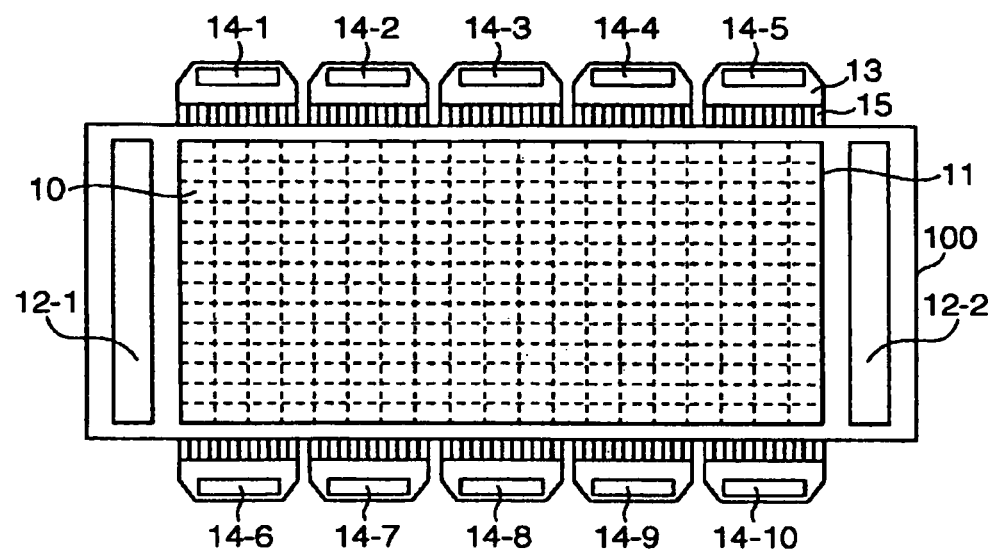
FIG. 1 is a schematic of an overview of an organic EL display according to exemplary embodiment 1.

This exemplary embodiment is described below by referring to the drawings.

FIG. 1 is a schematic of an overview of an organic EL display panel. The panel includes a plurality of pixels 10 arranged in a matrix with N rows and M columns. The panel has a pixel area 11 that forms a pixel matrix, an active matrix substrate 100 including scanning line drivers 12-1 and 12-2 that output scanning line signals to each pixel 10, and ten driver IC chips 14-1 to 14-10 lead-bonded to the outside edges of the active matrix substrate 100. The driver IC chips 14-1 to 14-10 each include a data line driver that sends data signals to each pixel 10. The driver IC chips 14-1, 14-5, 14-6, and 14-10, which are each located on the corners of the active matrix substrate 100, have power-supply circuits for supplying power to the active matrix substrate 100. The driver IC chips 14-1 to 14-10 are disposed by tape automated bonding (TAB) enclosed on tape carrier packages 13 with output leads 15 connected to electrode terminals (not shown in the drawings) of the active matrix substrate 100 via anisotropic conductive films. Data signals and electrical power are supplied to the active matrix substrate 100 from the driver IC chips 14-1 to 14-10 via the output leads 15.

Figure 3:
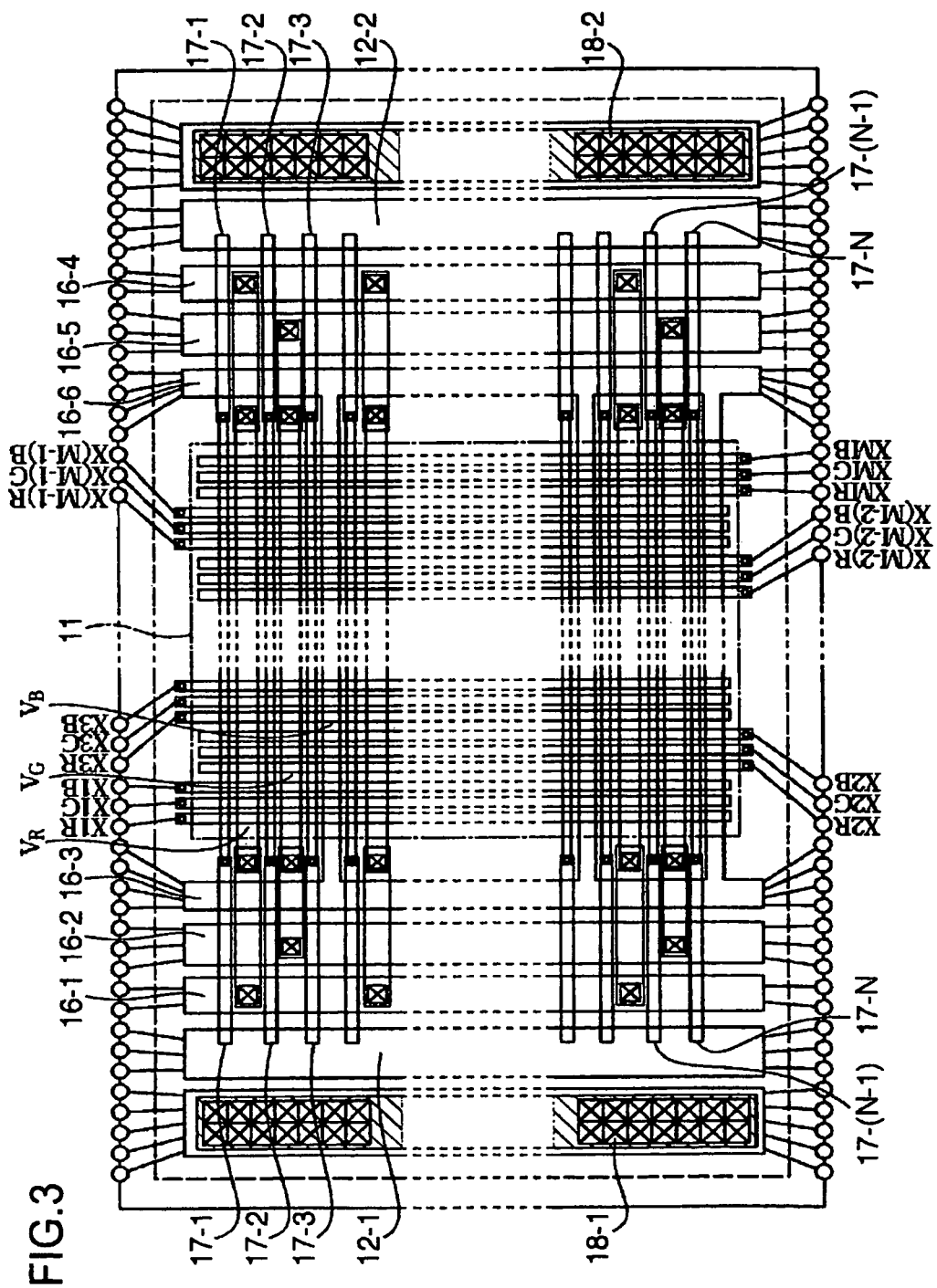
FIG. 3 is a schematic of the arrangement of the power-supply wiring according to exemplary embodiment 1.

FIG. 3 is a schematic describing in detail the structure of the power-supply wiring inside the active matrix substrate 100. For convenience, the pixels 10 are not shown in the drawing. In an exemplary embodiment of the present invention, the anode power supply to each pixel 10 is provided by forming on the periphery of the outside edges of the pixel area 11 power supply wiring with a relatively large line thickness (hereinafter "basic power-supply lines"), which receives a power-supply voltage from an external power supply and which forms a basic power-supply wiring system to distribute the power-supply voltage to each pixel 10. Then, from the basic power-supply lines, power-supply wiring with a relatively small line thickness width (hereinafter "main power-supply lines"), which branches off from the basic power-supply lines in a strip pattern, are densely wired within the pixel matrix. Directly supplying the power-supply voltage from the driver IC chips 14-1, 14-5, 14-6, and 14-10 to each pixel 10 via the output leads 15 using power-supply wiring with a small line thickness width causes the resistance of the power-supply wiring of a large area display to become very large and causes the electrical power consumption to increase. However, by forming basic power-supply lines with a relatively low resistance, which are basic lines to supply power, in the periphery of the outside edges of pixel area 11 and then supplying power from the basic power-supply lines to each pixel 10 via the main power-supply lines, the wiring resistance of the power-supply wiring can be reduced. Since the amount of electrical power needed for light-emitting of an organic EL element differs for each color, it is desirable to change the line thickness width of the basic power-supply line for each color.

The terms "basic power-supply line" and "main power-supply line" used in this document are used only to distinguish between the two power-supply lines. They are both the same type of power-supply wiring. Therefore, unless otherwise specified, when the term "power-supply wiring" is used, this includes both the basic and the main power-supply lines. This is also true for the term "auxiliary power-supply line" used later.

The power-supply wiring preferably has, but not limited to, the following arrangement: basic power-supply lines form pairs in the periphery of the outside edges of the pixel area 11, while the main power-supply lines are wired in strip pattern in a direction that intersects the basic power-supply lines. The desirable location to arrange the basic power-supply lines is the periphery of the outside edges of the pixel area 11. The location, however, is not limited to this, and the basic power-supply wiring may be arranged inside the pixel area 11. In the example shown in the above-described drawing, the basic power-supply lines 16-1 to 16-6 are linearly and symmetrically arranged so that the basic power-supply lines 16-1 to 16-3, which receive power from the driver IC chips 14-1 and 14-6, are arranged in the vicinity of the outside edge of the pixel area 11 shown on the left side of the drawing, while the basic power-supply lines 16-4 to 16-6, which receive power from the driver IC chips 14-5 and 14-10, are arranged in the vicinity of the outside edge of the pixel area 11 shown on the right side of the drawing. In other words, the basic power-supply lines 16-1 and 16-4 are symmetrically arranged, and, similarly, the basic power-supply lines 16-2 and 16-5, and 16-3 and 16-6 are also symmetrically arranged. The basic power-supply lines 16-1 and 16-4 are power-supply wiring to supply an anode power to the red organic EL elements and are connected to main power-supply lines $V_R$, which are formed on the pixel area 11 in the row direction in a strip pattern with equal pitch. Similarly, the basic power-supply lines 16-2 and 16-5 are power-supply wiring to supply an anode power to the green organic EL elements and are connected to main power-supply lines $V_G$, which are formed on the pixel area 11 in the row direction in a strip pattern with equal pitch. The basic power-supply lines 16-3 and 16-6 are power-supply wiring to supply an anode power to the blue organic EL elements, and are connected to main power-supply lines $V_B$, which are formed on the pixel area 11 in the row direction in a strip pattern with equal pitch. These main power-supply lines $V_R$, $V_G$, and $V_B$ are arranged in the pixel area 11 in a direction substantially orthogonal to the basic power-supply lines 16-1 to 16-6. Specifically, the main power-supply lines $V_R$, $V_G$, and $V_B$ are arranged so that they are linearly symmetrical to any row in the pixel matrix.

In the column direction of the pixel area 11, data lines XmR, XmG, and XmB (1≤m≤M) are arranged to form one group. For convenience, if the N and M are even numbers, the data lines XmR, XmG, and XmB (m=2i−1 (1≤i≤M/2)) of the odd numbered columns supply the data signals sent from the driver IC chips 14-1 to 14-5 to the pixels 10 and are arranged from the top to the bottom of the drawing of the active matrix substrate 100. Conversely, the data lines XmR, XmG, and XmB (m=2i−1 (1≤i≤M/2)) of the even numbered columns supply the data signals sent from the driver IC chips 14-6 to 14-10 to the pixels 10 and are arranged from the bottom to the top of the drawing of the active matrix substrate 100. Furthermore, on the outer sides of the substrate of the basic power-supply lines 16-1 to 16-3 and 16-4 to 16-6, the scanning line drivers 12-1 and 12-2 are mounted, respectively. Both of the scanning line drivers 12-1 and 12-2 simultaneously drive each of the N number of scanning lines 17-1, 17-2, 17-3, . . . , and 17-N. In this way, by driving the scanning lines 17-1, 17-2, 17-3, . . . , and 17-N with a pair consisting of left and right scanning line drivers 12-1 and 12-2, it is possible to take measures against the disconnection of wires in a large display.

Although not shown in the above diagram, in the direction perpendicular to the paper surface, a cathode film, which is a common electrode for each pixel 10, is disposed on the upper layer of the active matrix substrate 100. It is desirable to compose the cathode of a material that can inject as many electrons as possible, i.e., a material with a small work function. For such a conductive material, a metal thin-film, such as calcium, lithium, or aluminum is suitable. The structure described in the above drawing is a so-called bottom-emission structure, which emits light from the active matrix substrate 100 side. The present invention, however, is not limited to this, and the structure may be a so-called top-emission structure, which uses a light-transmitting conductive film as a cathode to emit light. When adopting a top-emission structure, the cathode may be a light-transmitting conductive material, such as ITO or a semi-transparent conductive metal thin layer including a metal, such as calcium, lithium, or aluminum, which is thin enough to transmit light. Using a semi-transparent conductive metal layer reduces the resistance of the cathode. On the outermost side of the active matrix substrate 100, there are contacting portions 18-1 and 18-2 to make contact with the cathode.

Figure 5:
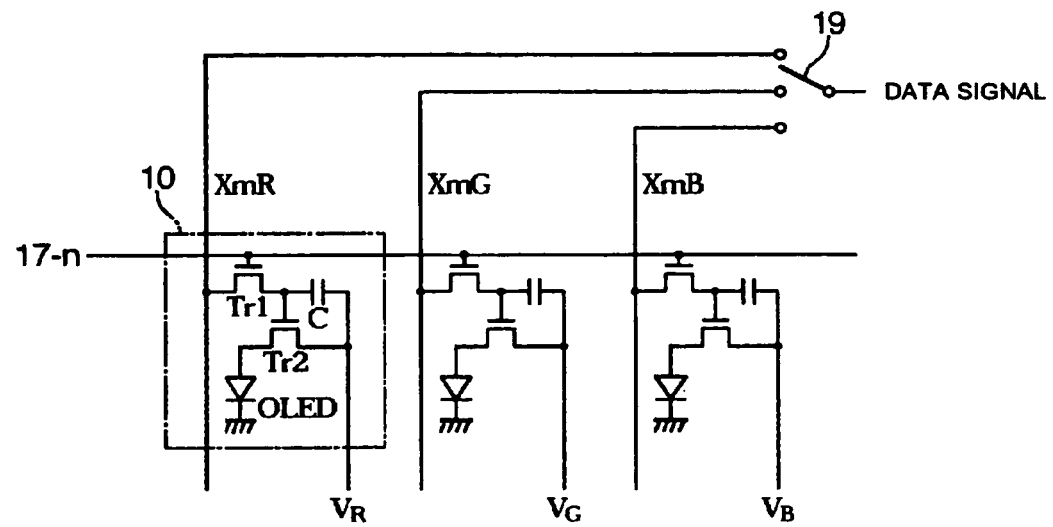
FIG. 5 is a schematic of the main pixel circuit of the pixels according to exemplary embodiment 1.

FIG. 5 is a schematic of the main circuit of the pixel 10 located in row n, column m. Taking a close look at the red pixel 10, this pixel 10 includes a switching transistor Tr1, whose gate terminal connects to the scanning line 17-n, a capacitor C, which maintains the data signal sent from the data line XmR for one frame period, a light emitting portion OLED composed of an organic EL element, and a driving transistor Tr2, which receives power from the main power line $V_R$ and supplies driving power to the light-emitting portion OLED. One pixel is composed of three sub-pixels, R, G, and B. Therefore, in the example described in the above drawing, each pixel needs one scanning line 17-n and three data lines, XmR, XmG, and XmB. Since large displays have a great number of pixels, using three data lines for one pixel causes the total number of data lines to become enormous. Thus, the present invention preferably has, but not limited to, the following arrangement: analog switches 19 to switch the data signal output from the driver IC chips to data lines, XmR, XmG, or XmB may be provided to reduce the number of data lines from the driver IC chips. The analog switches 19, however, are not essential and may be provided if required.

This exemplary embodiment is structured so that driver IC chips drive and control the pixels 10, providing a driver circuit suitable for a large display panel. Furthermore, on the periphery of the outer edges of the pixel area 11, the thick basic power-supply lines 16-1 to 16-6 are disposed in the column direction and the thin main power-supply lines are disposed in a strip pattern in the row direction from the basic power-supply lines 16-1 to 16-6 to the pixel area 11. This structure lowers the resistance of the anode power-supply wiring, providing an electro-optical device suitable for a large display. In the example above, the basic power-supply lines 16-1 to 16-6 are arranged in the column direction, while the main power-supply lines are arranged in the row direction. The present invention, however, is not limited to this arrangement, and the basic power-supply lines 16-1 to 16-6 may be arranged in the row direction, while the main power-supply lines are arranged in the column direction.

Exemplary Embodiment 2

Figure 4:
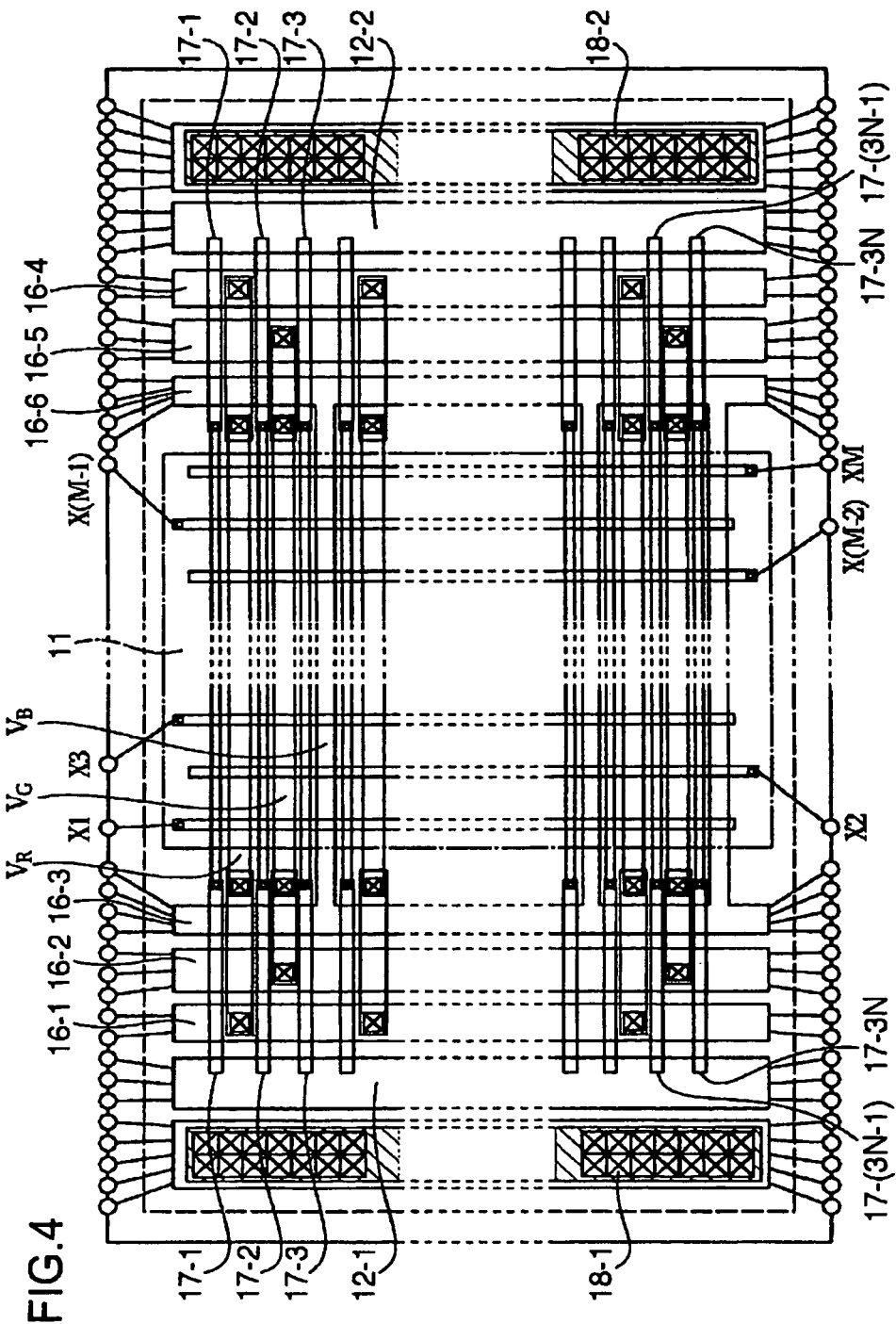
FIG. 4 is a schematic of the arrangement of the power-supply wiring according to exemplary embodiment 2.
Figure 6:
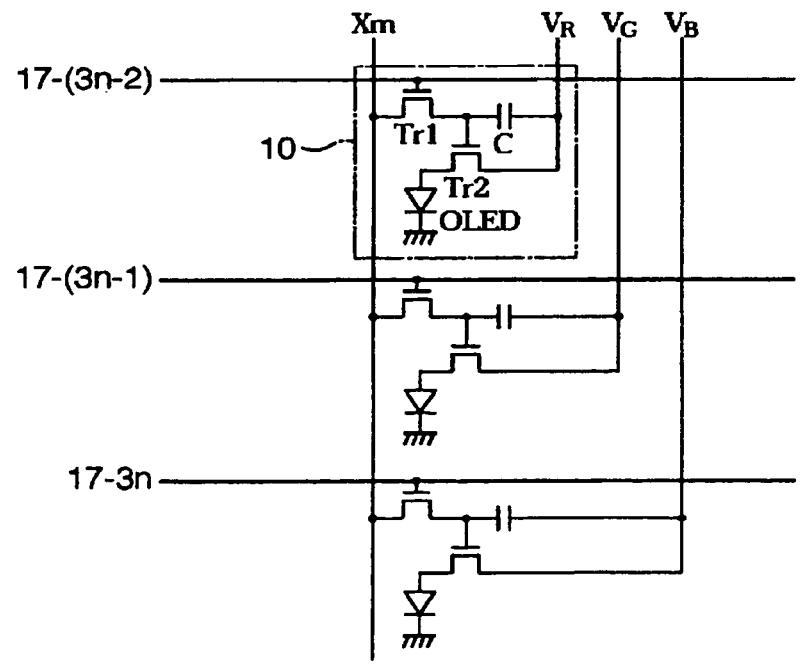
FIG. 6 is a schematic of the main pixel circuit of the pixels according to exemplary embodiment 2.

FIG. 4 is a schematic of the arrangement of power-supply wiring related to a second exemplary embodiment according to the present invention. FIG. 6 is a schematic showing the main circuit of a pixel 10 located in row n, column m according to this exemplary embodiment. Within the drawing, reference numerals that are the same as FIGS. 3 and 5 represent the same elements as those of FIGS. 3 and 5 and the descriptions are omitted. In FIG. 6, taking a close look at a red pixel 10, this pixel 10 includes a switching transistor Tr1, whose gate terminal connects to a scanning line 17-(3n−2), a capacitor C, which maintains a data signal sent from a data line Xm for one frame period, a light emitting portion OLED composed of an organic EL element, and a driving transistor Tr2, which receives power from a main power line $V_R$ and supplies driving power to a light-emitting portion OLED. Green and blue pixels 10 also have the same circuit structure, receive power from main power-supply lines $V_G$ and $V_B$ respectively, and have a common data line Xm. One pixel is composed of three sub-pixels, R, G, and B. Therefore, in the example shown in the above drawing, each pixel needs three scanning lines 17-(3n–2), 17-(3n–1), and 17-3n and one data line Xm. In other words, the number of scanning lines of example described in this exemplary embodiment is three times more than that of exemplary embodiment 1, requiring a driving frequency for scanning line drivers 12-1 and 12-2 three times more than that of exemplary embodiment 1. However, as shown in FIG. 4, the number of data lines Xm required for this exemplary embodiment is ⅓ of that required for exemplary embodiment 1. The basic arrangement of the power-supply wiring of this exemplary embodiment is the same as exemplary embodiment 1. Therefore, the same effect as in exemplary embodiment 1 may be obtained for this exemplary embodiment as well.

Exemplary Embodiment 3

Figure 7:
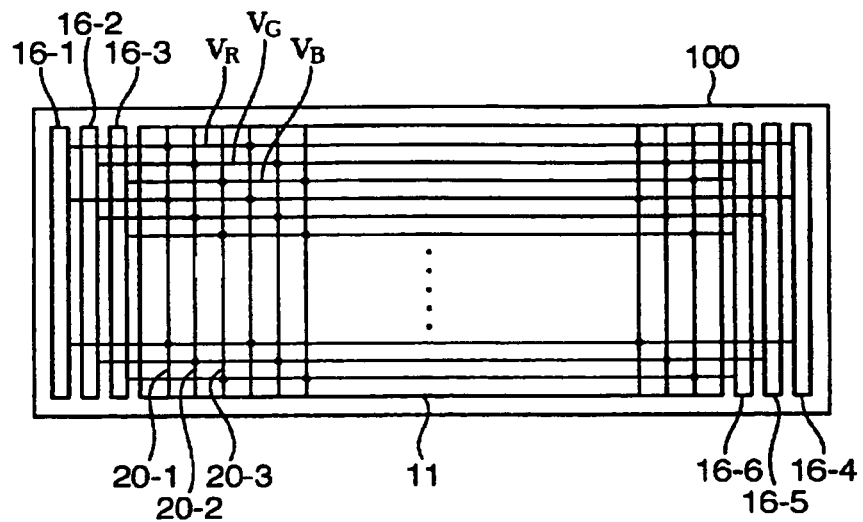
FIG. 7 is a schematic of an overview of an organic EL display according to exemplary embodiment 3.

FIG. 7 is a schematic of the arrangement of power-supply wiring related to a third exemplary embodiment. In the drawing, only the power-supply wiring is shown and data lines, scanning lines, and cathode contacting portion are not shown to simplify the description. This exemplary embodiment is similar to exemplary embodiment 1 in that basic power-supply lines 16-1 to 16-3 are arranged in the vicinity of the outside edge of pixel area 11 shown on the left side of the drawing and basic power-supply lines 16-4 to 16-6 are arranged in the vicinity of the outside edge of the pixel area 11 shown on the right side of the drawing. The basic power-supply lines 16-1 and 16-4 are power-supply lines to supply an anode power supply to red organic EL elements and are connected to main power-supply lines $V_R$ arranged on the pixel area 11 in the row direction in a strip pattern. Similarly, the basic power-supply lines 16-2 and 16-5 are power-supply lines to supply an anode power to green organic EL elements and are connected to main power-supply lines $V_G$ arranged on the pixel area 11 in the row direction in a strip pattern. The basic power-supply lines 16-3 and 16-6 are power-supply lines to supply an anode power to blue organic EL elements and are connected to main power-supply lines $V_B$ arranged on the pixel area 11 in the row direction in a strip pattern.

Within the pixel area 11, auxiliary power-supply lines 20-1, 20-2, 20-3, . . . , are further arranged in the column direction so that they intersect the main power-supply lines $V_R$, $V_G$, and $V_B$. The auxiliary power-supply line 20-1 is electrically connected to n number of main power-supply lines $V_R$ to reduce the resistance of the power-supply wiring. Also, the auxiliary power-supply lines 20-2 and 20-3 are electrically connected to n number of main power-supply lines $V_G$ and $V_B$, respectively. In this exemplary embodiment, the anode power-supply wiring is wired within the pixel area 11 in a matrix to reduce the wiring resistance of the power-supply wiring. As a result, in a large display that uses electrically driven light-emitting elements as light-emitting sources, a uniform current is supplied to each pixel. Thus, an electro-optical device with a high-quality display performance, which enables an even display, is provided.

Exemplary Embodiment 4

Figure 2:
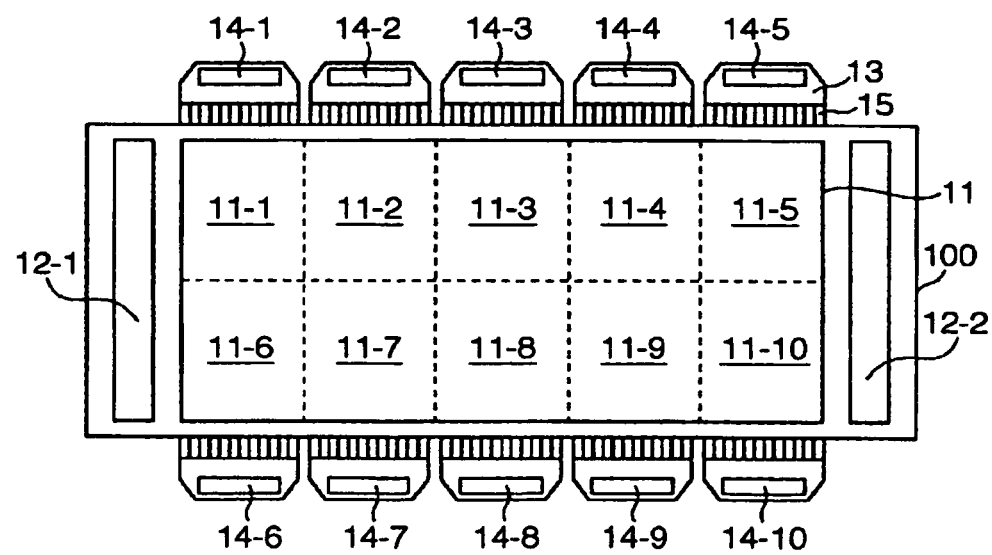
FIG. 2 is a schematic of an overview of an organic EL display according to exemplary embodiment 4.

FIG. 2 is a schematic of an overview of an organic EL display panel for describing a fourth exemplary embodiment according to the present invention. In this diagram, reference numerals that are the same as in FIG. 1 represent the same elements as those of FIG. 1 and the descriptions are omitted. The organic EL display panel includes a pixel area 11 composed of a plurality of pixels arranged in a matrix with N rows and M columns, an active matrix substrate 100 including scanning line drivers 12-1 and 12-2 that output scanning line signals to each pixel 10, and ten driver IC chips 14-1 to 14-10 lead-bonded to the periphery of the active matrix substrate 100.

The pixel area 11 is sectioned into pixel groups (blocks) 11-1 to 11-10, which each include a plurality of pixels. These pixel blocks 11-1 to 11-10 receive an anode power-supply from respective driver IC chips 14-1 to 14-10. In other words, a pixel group 11-k (1≤k≤10) receives an anode power-supply from a driver IC chip 14-k, enabling uniform and substantial power-supply to a large display panel with a large area. The arrangement of power-supply wiring of each pixel group 11-k is not limited to this exemplary embodiment. For example, as in exemplary embodiments 1, 2, and 3 described above, the basic power-supply lines may be arranged in the row and/or column directions, the thin main power-supply lines connected to the basic power-supply lines may be arranged in a strip pattern, and the auxiliary power-supply lines may be arranged in a matrix to reduce the resistance of the wiring of the anode power-supply, if necessary.

This exemplary embodiment finely adjusts the power-supply voltage of the driver IC chips 14-1 to 14-10 to correct the difference in properties among these driver IC chips. As a result, an electro-optical device suitable for a large display panel with a high quality display performance is provided.

Exemplary Embodiment 5

Figure 8:
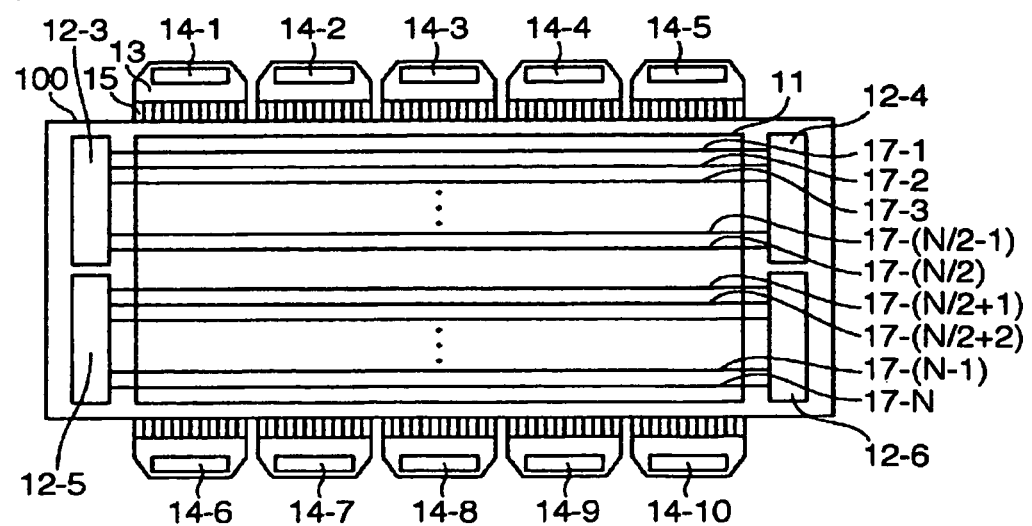
FIG. 8 is a schematic of an overview of an organic EL display according to exemplary embodiment 5.

FIG. 8 is a schematic of an overview of an organic EL display panel for describing a fifth exemplary embodiment according to the present invention. In this diagram, reference numerals that are the same as FIG. 1 represent the same elements as those of FIG. 1 and the descriptions are omitted. The organic EL display panel includes a pixel area 11 composed of a plurality of pixels arranged in a matrix with N rows and M columns, an active matrix substrate 100 including scanning line drivers 12-3 to 12-6 that output scanning line signals to each pixel 10, and ten driver IC chips 14-1 to 14-10 lead-bonded to the periphery of the active matrix substrate 100. The left and right scanning line drivers 12-3 and 12-4 make up a pair and simultaneously drive N/2 scanning lines 17-1 to 17-(N/2), which are arranged on the upper half of the screen. The left and right scanning line drivers 12-5 and 12-6 make up another pair and simultaneously drive N/2 scanning lines 17-(N/2+1) to 17-N, which are arranged on the lower half of the screen.

By adopting the above structure, the scanning line drivers 12-5 and 12-6 drive the scanning lines 17-(j+N/2) while the scanning line drivers 12-3 and 12-4 drive the scanned lines 17-j (1≤j≤N/2). As a result, the driving frequency for each of scanning line drivers 12-3 to 12-6 may be reduced to ½. The value of N is large for a large display, and, therefore, the number of scanning lines that can be scanned for one frame period is limited. By adopting the above structure, however, the driving frequency of the scanning line drivers 12-3 to 12-6 can be reduced so as to be suitable for a large display.

The arrangement of power-supply wiring within the pixel area 11 may be any arrangement described in exemplary embodiments 1 to 4. The number of scanning lines simultaneously driven is not limited to two lines, and it may be 3 lines or more, for example.

What is claimed is:

1. An electro-optical device, comprising:
   a first substrate provided with a rectangular pixel area including a plurality pixels, each of the pixels including a plurality of sub-pixels, the sub-pixels each including one of a plurality of electro-optical elements, the rectangular pixel area being defined in part by a first side and a second side substantially parallel to the first side, a plurality of data lines supplying data signals to the pixels, one of the data lines being directly connected to all of the sub-pixels of a common one of the pixels to supply a common data signal to the sub-pixels of the common one of the pixels;

a plurality of second substrates, which are different from the first substrate and which are provided with a power source line that supplies a power source voltage to drive the electro-optical elements, at least one of the second substrates being arranged on the first side and at least another one of the second substrates being arranged on the second side, a pair of scanning line drive circuits arranged on third and four sides respectively, and arranged so as to sandwich the pixel area, a plurality of basic power-supply lines being arranged between the scanning line drive circuits and the pixel area, and a plurality of main power-supply lines extending orthogonal to the plurality of basic power-supply lines and being arranged between the scanning line drive circuits, each main supply line having a width smaller than that of one of the plurality of basic power-supply lines.

2. The electro-optical device as set forth in claim 1, wherein:

the rectangular pixel area is further defined by the third side substantially perpendicular to each of the first and second sides and the fourth side substantially parallel to the third side to form four corners, the plurality of second substrates comprising at least four second substrates respectively arranged at the four corners of the pixel area.

3. The electro-optical device set forth in claim 1, further comprising:

a power source supply circuit which drives the electro-optical elements, the power source supply circuit being on at least two of the second substrates.

4. The electro-optical device as set forth in claim 1, further comprising:

the plurality of second substrates being constituted by TAB.

5. The electro-optical device as set forth in claim 1, further comprising:

the power source line supplying a power source to an anode side of the electro-optical elements via a drive transistor provided with a pixel.

* * * * *